United States Patent [19]

Onuma et al.

[11] Patent Number: 4,767,005
[45] Date of Patent: Aug. 30, 1988

[54] PACKAGING CONTAINER

[75] Inventors: Toshihide Onuma; Shigeo Katsura, both of Saitama, Japan

[73] Assignee: Nippon Mining Co., Ltd., Tokyo, Japan

[21] Appl. No.: 134,489

[22] Filed: Dec. 18, 1987

[30] Foreign Application Priority Data

Dec. 27, 1986 [JP] Japan .................... 61-310679

[51] Int. Cl.$^4$ .............................................. B65D 73/02
[52] U.S. Cl. .................... 206/334; 206/583; 206/460
[58] Field of Search ............... 206/583, 460, 328, 334

[56] References Cited

U.S. PATENT DOCUMENTS

| 3,876,812 | 4/1975 | Peters | 206/583 |
|---|---|---|---|
| 4,053,049 | 10/1977 | Beauvais | 206/460 |
| 4,209,091 | 6/1980 | Lieberman | 206/460 |
| 4,562,924 | 1/1986 | Okamoto | 206/460 |
| 4,697,701 | 10/1987 | Ying | 206/460 |

Primary Examiner—Joseph Man-Fu Moy
Attorney, Agent, or Firm—Seidel, Gonda, Goldhammer & Abbott

[57] ABSTRACT

A container for shipping and storing articles such as semi-conductor materials, comprises a first case member having a bottom wall, a second case member having an annular flange, and a supporting sheet having a thin flexible base film and an adhesive layer applied thereto. The adhesive layer is capable of tentatively adhering thereto an article to be packaged. The first and second case members is adapted to make with each other in a sealed manner and to cooperate to define an internal space therebetween when mated together. The supporting sheet is placed in said first case member with the adhesive layer facing toward the second case member and with the peripheral margin of the supporting sheet held between the bottom wall of the first case member and the annular flange of the second case member.

3 Claims, 3 Drawing Sheets

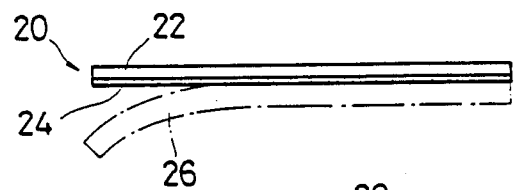
FIG.4
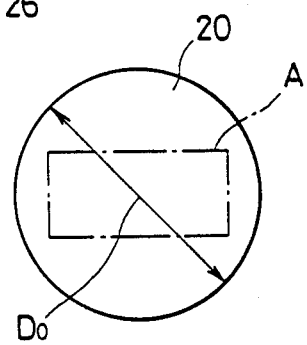
FIG.5
FIG.6(A)
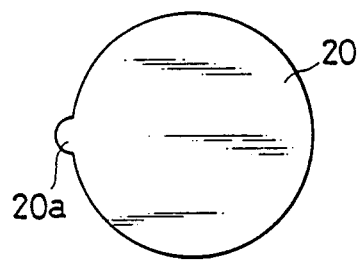
FIG.6(B)
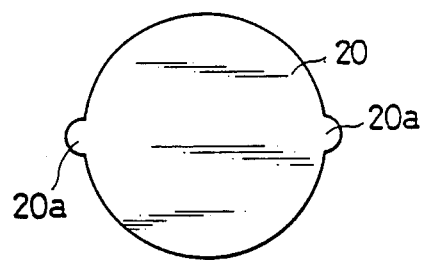
FIG.6(C)
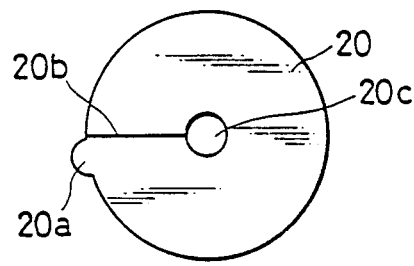
FIG.6(D)
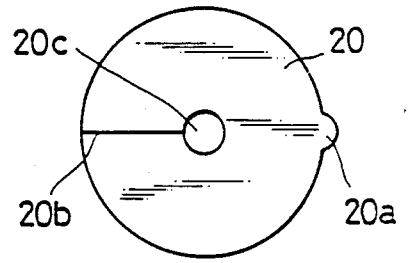

PACKAGING CONTAINER

TECHNICAL FIELD

This invention relates generally to a packaging container for shipping and storing semiconductor materials, devices and the like, and particularly to a packaging container useful for shipping and storing semiconductor wafers.

BACKGROUND ART

Careful handling is required when shipping or storing semiconductor materials and devices such as wafers as they are very fragile and susceptible to fracture and contamination by the surrounding atmosphere. FIGS. 7 and 8 illustrate one of typical prior art packaging containers heretofore widely used for shipping and storing semiconductor wafers. As shown in FIGS. 7 and 8, the packaging container comprises a lower circular case member 2 having a conncave bottom wall 2a which is adapted to support a wafer A thereon, a dish-shaped retainer 4 having a plurality of radial arms 4a extending radially outwardly therefrom, and a mating upper case member 6 adapted to fit over the lower case member. When mated with the lower case member, the upper case member urges the retainer 4 to press the radial arms 4a against the peripheral margin of the wafer A to thereby hold the wafer between the case members.

While such conventional container is very effective to package circular wafers, it has been found unsuitable to package rectangular wafers, since a rectangular wafer contacts only on its four corners with the concave bottom wall of the lower case member 2, so that stresses tend to be concentrated on the four corners to possibly break the wafer at the corners. In addition, pressing forces exerted on the wafer by the retainer 4 tend to produce internal strains within the wafer material, resulting in undesirably degrading the wafer quality.

SUMMARY OF THE INVENTION

It is an object of the invention to provide a packaging container which is useful to efficiently ship and store wafers and other semiconductor materials, devices and the like of various shapes and sizes, particularly of a rectangular shape without the risk of causing damages to and internal stresses in the wafers, and which facilitates removal of wafers from the container.

Briefly, in order to accomplish the foregoing object and others, the present invention provides a packaging container for shipping and storing articles such as semiconductor materials, devices and the like, comprising a first case member having a bottom wall, a second case member having an annular flange, and a supporting sheet having a thin flexible base film and an adhesive layer applied thereto, said adhesive layer being capable of tentatively adhering thereto an article to be packaged, said first and second case members being adapted to mate with each other in a sealed manner and to cooperate to define an internal space therebetween when mated together, said supporting sheet being placed in said first case member with the adhesive layer facing toward said second case member and with the peripheral margin of the supporting sheet held between the bottom wall of the first case member and the annular flange of the second case member.

BRIEF DESCRIPTION OF THE DRAWINGS

These and other more detailed and specific objects and features of the present invention will be more fully disclosed in the following specification with reference to the accompanying drawings, in which:

FIG. 4 is a sectional view of the supporting sheet used in the container shown in FIG. 1;

FIG. 5 is a plan view of the supporting sheet;

FIGS. 6A to D are plan views of modified forms of the supporting sheet;

DETAILED DESCRIPTION OF THE PREFERRED EMBODIMENTS

Figure 1:
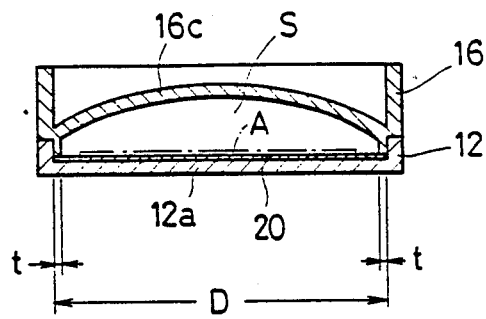
FIG. 1 is a vertical sectional view of one embodiment of the packaging container according to the present invention, showing the two case members mated together.
Figure 2:
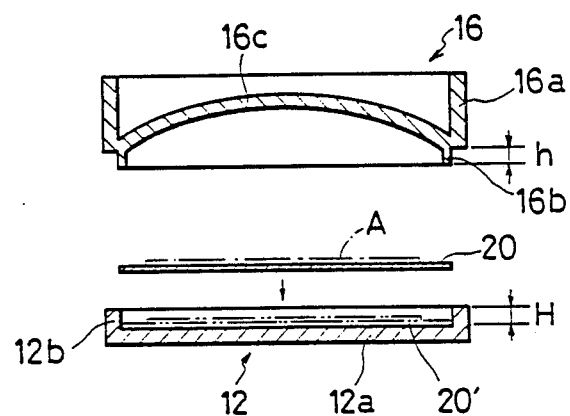
FIG. 2 is a sectional view similar to FIG. 1, but showing the two case members separated.

Referring to FIGS. 1 and 2, one embodiment of the packaging container according to the present invention is shown which comprises a first case member or a lower case member 12 in the illustrated embodiment and a second case member or an upper case member 16 adapted to removably and hermetically mate with the first case member by threading engagement or press-fitting. More specifically, the first case member 12 is in the form of a circular dish-like tray having a bottom wall 12a and an annular peripheral wall 12b extending vertically from the periphery of the bottom wall. In order to accommodate a rectangular wafer about 15 mm×40 mm, for example, it will be appropriate that the inside diameter D and depth H of the first case member be in the range of 50 mm to 60 mm and 2 mm to 5 mm, respectively, although such dimensions may vary depending on the size of the particular article to be packaged.

The second case member 16 includes a cylindrical peripheral wall 16a having an outside diameter substantially equal to that of the first case member 12, a diaphragm 16c surrounded by the peripheral wall 16a which cooperates with the first case member to define a closed space S when the first and second case members are mated together as shown in FIG. 1, and an annular flange 16b extending vertically from the end of the second case member confronting the first case member. The vertical annular flange 16b is adapted to closely fit in the peripheral wall 12a of the first case member. The flange 16b may have a height h equal to or slightly greater than the depth H of the first case member 12 and preferably a thickness t in the range of 0.5 to 2 mm in this embodiment. The diaphragm 16c is shown as being of a partial spherical shape in the illustrated embodiment but may be planar, if desired.

According to the present invention, a supporting sheeet 20 is provided to support an article A to be packaged such as a wafer. As best shown in FIG. 4, the supporting sheet 20 comprises a base film 22 and an adhesive layer 24. Applied to the adhesive layer is a protective or release sheet 26 which is to facilitate handling of the supporting sheet prior to use.

The base film 22 is of a shape complementary to that of the interior of the first case member. In this embodiment it is circular and has an outside diameter Do (FIG. 5) approximately equal to the inside diameter D of the first case member 12. The base film 22 may preferably be formed of a thin and flexible material having a film thickness in the order of 0.01 mm to 0.2 mm. Suitable materials may include plastic films such as polyethylene, polyvinyl chloride, polypropylene, vinyl, Teflon, polyester, cellophane, acetate and the like, paper materials such as planar paper and crape paper, and aluminum foil. In the illustrated embodiment a polyethylene film 0.085 mm thick may be used.

The adhesive layer 24 may be any suitable material so long as it has the nature of tentatively adhering thereto an article A such as wafer but allowing the article to be peeled from the adhesive layer by applying a certain amount of external force.

Suitable materials for this purpose may include acrylic, silicon oxide (silicone)-based, polyamide-based, epoxyphenolic, phenolic, polyvinyl acetal-based, polyolefin-based, and ionomer-based adhesives.

In this embodiment an acrylic adhesive material less than 10 μm thick was applied to a polyethylene film having a thickness of 0.085 mm to for a supporting sheet 20.

Figure 3:
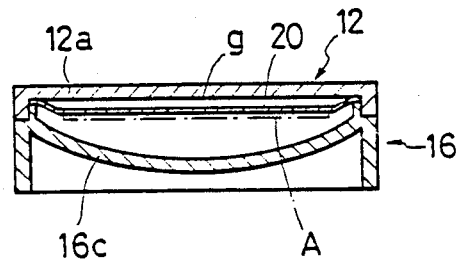
FIG. 3 is a sectional view similar to FIG. 1, but showing the container turned upside down.
Figure 7:
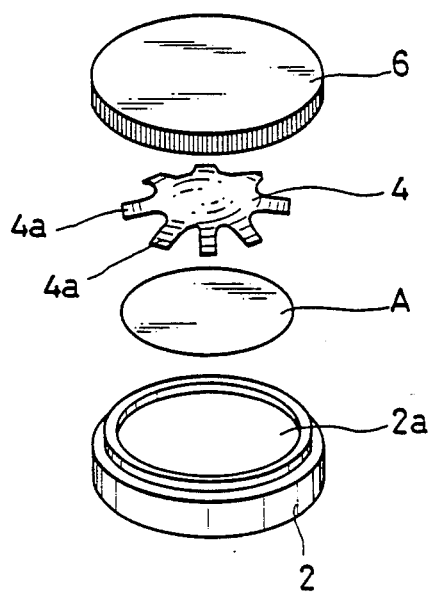
FIGS. 7 and 8 are an exploded perspective view and a vertical cross-sectional view, respectively of a typical prior art packaging container.
Figure 8:
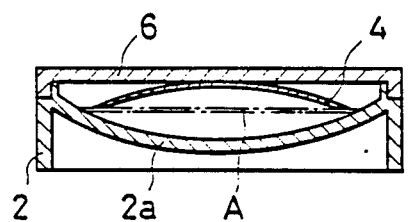

In use, the protective sheet 26 is removed from the supporting sheet 20 (FIG. 4), and an article A to be packaged such as a wafer is placed centrally on the exposd adhesive layer 24 of the supporting sheet to be tentatively bonded thereto (FIG. 5). The supporting sheeet 20 having the article A bonded thereto is then placed in the lower case member 12 with the article A and the adhesive layer facing upward as shown in FIG. 2. The supporting sheet 20 is snugly fitted in the first case member 12 and deposited on the bottom wall 12a thereof, as the supporting sheet is of a shape complementary to that of the interior of the first case member 12 as stated herein above. Then, the second case member 16 is nested in the first case member 12 with the annular flange 16b of the second case member press fitted with the annular peripheral wall 12b of the first case member, whereby the two case members are mated together in a sealed manner with the supporting sheet 20 held between the annular flange 16b of the second case member and the bottom wall 12a of the first case member. It is also to be noted that the adhesive layer of the supporting sheet 20 adheres to the end face of the annular flange 16b and thereby firmly retained in the container. Consequently, even though the packaging container is turned upside down and if the supporting sheet 20 is deflected due to the weight of the article A to produce a gap g between the supporting sheet and the bottom wall 12a of the first case member as shown in FIG. 3, there is no possibility that the article A may come into contact with the diaphragm 16c of the second case member and be damaged. In addition, since the supporting sheet 20 is resiliently flexible to some extent, it serves to protect a fragile article A such as a wafer by absorbing any shock that may be exerted on the packaging container.

When it is desired to remove the article from the packaging container, the first and second case members are separated from each other. In this regard it is to be appreciated that the supporting sheet 20 is taken out of the container while it is bonded to the annular flange 16b so that the operator need not take the supporting sheet out of the container by using his hand or with the aid of a tool. Thereafter, the operator grasps the supporting sheet 20 by its peripheral margin and separates it from the annular flange 16b and then may remove the article A from the sheet.

FIG. 6 shows various modified forms of the supporting sheet 20. In FIGS. (A) and (B) the sheet 20 is formed with one or two tabs 20a projecting from the outer periphery thereof by which the operator may conveniently grasp the sheet when he places it in the first case member 12 and separates it from the second case member 16. In the embodiment shown in FIGS. 6 (C) and (D) the sheet 20 is further formed with a central small aperture 20c and a slit 20b extending from the aperture to the outer periphery. The aperture 20c is designed to hold the article such as a wafer A by a suction device, not shown while the wafer is peeled from the supporting sheet 20. More specifically, with the wafer held by the suction device applying suction force to the back side of the wafer, the operator may manually grasp the supporting sheet 20 by the tab 20b to separate it from the wafer along the slit 20b.

While the packaging container has been described as being on a circular shape hereinabove, this invention is not to be limited to such form. The entire configuration of the container may be rectangular so long as the first and second case members 12 and 16, respectively may be mated with each other in a sealed manner and cooperate to define therein a space when their open ends are mated together. It is preferable that the two case members 12, 16 be made of a transparent plastic material.

Articles to be packaged in the container according to the present invention are not to limited to rectangular ones. The container may be used to efficiently store and ship wafers and other semiconductor materials and devices of circular and other various shapes and sizes.

From the foregoing discussion, it is to be appreciated that the packaging container of this invention permits articles of various shapes and sizes such as wafers to be stored in and be removed from the container without exerting direct grasping forces on the articles, whereby there is no risk of causing damages to the articles or producing internal stresses therein.

The above description is included to illustrate the preferred embodiments of the invention and is not meant to limit the scope of the invention. From the above discussion, many variations will be apparent to one skilled in the art that would yet be encompassed by the spirit and the scope of the invention.

We claim:

1. A packaging container for shipping and storing articles such as semi-conductor materials, devices and the like, comprising a first case member having a bottom wall, a second case member having an annular flange, and a supporting sheet having a thin flexible base film and an adhesive layer applied thereto, said adhesive layer being capable of tentatively adhering thereto an article to be packaged, said first and second case members being adapted to mate with each other in a sealed manner and to cooperate to define an internal space therebetween when mated together, said supporting sheet being placed in said first case member with the adhesive layer facing toward said second case member and with the peripheral margin of the supporting sheet held between the bottom wall of the first case member and the annular flange of the second case member.

2. The packaging container of claim 1, wherein said base film is formed of a thin and flexible material having a film thickness of 0.01 mm to 0.2 mm, and said adhesive layer is formed of a material having the nature of tentatively adhering thereto an article to be packaged but allowing the article to be peeled from the adhesive layer by applying a certain amount of external force.

3. The packaging container of claim 1 or 2, wherein said base film is formed of a material selected the group of plastic films such as polyethylene, polyvinyl chloride, polypropylene, vinyl, Teflon, polyester, cellophane, acetate and the like, paper materials such as planar paper and crape paper, and aluminum foil, and said adhesive layer is a material selected from the group of acrylic, silicon oxide (silicone)-based, polyamide-based, epoxy-phenolic, phenolic, polyvinyl acetal-based, polyolefin-based, and ionomer-based adhesive materials.

* * * * *